(12) United States Patent
Fernandez

(10) Patent No.: US 9,164,826 B2
(45) Date of Patent: Oct. 20, 2015

(54) METHOD AND APPARATUS TO RECOVER FROM AN ERRONEOUS LOGIC STATE IN AN ELECTRONIC SYSTEM

(71) Applicant: Devon Fernandez, Londonderry, NH (US)

(72) Inventor: Devon Fernandez, Londonderry, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 213 days.

(21) Appl. No.: 13/747,870

(22) Filed: Jan. 23, 2013

(65) Prior Publication Data

US 2014/0208151 A1    Jul. 24, 2014

(51) Int. Cl.

| G06F 11/07 | (2006.01) |
|---|---|
| G06F 11/08 | (2006.01) |
| G05B 19/045 | (2006.01) |
| G05B 19/4063 | (2006.01) |
| G06F 11/10 | (2006.01) |
| B60G 17/0185 | (2006.01) |
| H03K 17/24 | (2006.01) |
| H03K 19/007 | (2006.01) |
| H03K 19/003 | (2006.01) |

(52) U.S. Cl.
CPC ............ *G06F 11/08* (2013.01); *B60G 17/0185* (2013.01); *G05B 19/045* (2013.01); *G05B 19/4063* (2013.01); *G06F 11/0793* (2013.01); *G06F 11/0796* (2013.01); *G06F 11/102* (2013.01); *G06F 11/1032* (2013.01); *H03K 19/007* (2013.01); *H03K 19/00392* (2013.01); *H03K 17/24* (2013.01)

(58) Field of Classification Search
CPC ... G06F 11/102; G06F 11/1032; G06F 11/08; G06F 11/0796; G05B 19/045; G05B 19/4063; B60G 17/0185

USPC .............................. 714/21, 52, 802; 701/30.8
See application file for complete search history.

(56) References Cited

U.S. PATENT DOCUMENTS

| 4,727,548 A | * | 2/1988 | Dickey .......................... 714/803 |
|---|---|---|---|
| 5,382,890 A | * | 1/1995 | Moh et al. ................. 318/400.22 |
| 5,650,719 A | | 7/1997 | Moody et al. |
| 6,690,155 B2 | | 2/2004 | Vig et al. |

(Continued)

FOREIGN PATENT DOCUMENTS

WO    WO 02/055356 A1    7/2002

OTHER PUBLICATIONS

IBM Corporation, Parity Predict for Sequencer Invalid State Transitions, Feb. 1, 1990, IBM Technical Disclosure Bulletin, vol. 32 Issue 9B, pp. 24-25.*

(Continued)

*Primary Examiner* — Gabriel Chu
*Assistant Examiner* — Paul Contino
(74) *Attorney, Agent, or Firm* — Daly, Crowley, Mofford & Durkee, LLP

(57) ABSTRACT

An electronic system includes circuitry to detect errors in logic state in the system and to initiate corrective action when one or more errors are detected. In some embodiments, redundant information is stored within a system that is associated with an operational state of the system. If the operational state of the system is subsequently corrupted as a result of an electrical or mechanical overstress condition, resulting errors may be detected by comparing or otherwise processing the stored operational state information and the redundant information.

30 Claims, 2 Drawing Sheets

(56) References Cited

U.S. PATENT DOCUMENTS

| | | | |
|---|---|---|---|
| 6,976,202 B1* | 12/2005 | Rezvani et al. | 714/752 |
| 7,036,059 B1 | 4/2006 | Carmichael et al. | |
| 7,253,614 B2 | 8/2007 | Forrest et al. | |
| 7,982,454 B2 | 7/2011 | Fernandez et al. | |
| 8,754,640 B2* | 6/2014 | Vig et al. | 324/207.25 |
| 9,002,616 B2* | 4/2015 | Genevrier et al. | 701/100 |
| 2004/0221193 A1* | 11/2004 | Armstrong et al. | 714/10 |
| 2008/0320365 A1* | 12/2008 | Richard | 714/758 |
| 2009/0144588 A1* | 6/2009 | Pothireddy et al. | 714/49 |
| 2011/0298447 A1 | 12/2011 | Foletto et al. | |
| 2013/0138322 A1* | 5/2013 | Genevrier et al. | 701/100 |

OTHER PUBLICATIONS

PCT Search Report of the ISA for PCT/US2014/010807 dated May 9, 2014.

PCT Written Opinion of the ISA for PCT/US2014/010807 dated May 9, 2014.

* cited by examiner

METHOD AND APPARATUS TO RECOVER FROM AN ERRONEOUS LOGIC STATE IN AN ELECTRONIC SYSTEM

FIELD

Subject matter disclosed herein relates generally to electronic systems and devices and, more particularly, to techniques and circuits for recovering from errors in electronic systems and devices caused by interference and/or electrical or mechanical overstress conditions.

BACKGROUND

Electronic systems and devices may be subject to interference and electrical or mechanical overstress conditions that undesirably alter their operational states. One area of electronics that is particularly prone to such stresses is automotive sensors. In automobiles, a combination of multiple mechanical and electrical systems are installed in close proximity and operated in varied environments. This creates an increased likelihood of electrical interference and sudden motion that can result in errors within a sensor. In many cases, a sensor will return to normal operation after a stress is applied. However, in some circumstances, the stress may cause a change to an electronic component or device that does not allow the sensor to return to correct operation without additional intervention. As can be appreciated, errors induced in this manner are undesirable in all electronics applications, but they are of particular concern in applications where human safety is involved, such as automobiles and other vehicles.

While many techniques exist for storing electronic data, contemporary circuit design overwhelmingly favors the use of digital circuitry to perform this function. In a sensor based application, the information being stored within digital storage circuitry may include the operational state of the sensor circuitry (e.g., state information within the state register of a state machine) and/or information about sensor inputs (e.g., sensor information stored since power on). Alteration of any of this date can lead to a malfunction of the sensor or other system. There is a need for techniques and circuits for identifying the occurrence of errors in electronic systems caused by overstress conditions. There is also a need for techniques and circuits for recovering from such errors.

SUMMARY

In accordance with one aspect of the concepts, systems, circuits, and techniques described herein, an electronic system comprises: first digital storage circuitry to store a current operational state of the electronic system; operational logic to determine a next operational state of the electronic system based, at least in part, on an input signal; redundancy logic to generate redundant information associated with the next operational state determined by the operational logic; second digital storage circuitry to store the redundant information; and error checking logic to process the current operational state stored in the first digital storage circuitry and the redundant information stored in the second digital storage circuitry to determine whether a error exists in the electronic system, the error checking logic including correction logic to initiate corrective action for the electronic system if an error is detected by the error checking logic.

In accordance with another aspect of the concepts, systems, circuits, and techniques described herein, a method for use in detecting and recovering from errors in an electronic system comprises: receiving one or more inputs signals; processing the one or more input signals to determine a next operational state associated with the electronic system; storing the next operational state information; processing the next operational state information to generate redundant information; storing the redundant information; processing the stored operational state information with the stored redundant information to determine whether one or more errors exist in the operational state information; and initiating corrective action if one or more errors are detected in the stored operational state information.

BRIEF DESCRIPTION OF THE DRAWINGS

The foregoing features may be more fully understood from the following description of the drawings in which.

DETAILED DESCRIPTION

Techniques, devices, and circuits described herein relate to the detection of and recovery from errors in electronic systems caused by electrical, mechanical, and/or thermal stresses applied to the systems during operation. In some embodiments, the techniques, devices, and circuits may be implemented within systems that use sensor elements to detect and measure one or more operational parameters of a larger system, (e.g., a magnetic position sensor system for use in automobile applications, etc.). In the discussion that follows, various principles, techniques, features, and circuits will be described in the context of sensor based systems. It should be appreciated, however, that many other applications also exist.

In an electronic system, operational data is often stored in one or more digital memory locations or registers during system operation. The operational data that is stored within an electronic system at a particular point in time may be referred to as the current "state," or "logic state," or "operational state" of the system. If one or more stresses occur during system operation, such as external noise, interference, or physical impact on the system, errors may occur in the stored values that can negatively affect system operation. In some cases, the negative effect may be short-lived, lasting only as long as the external stimulus itself. In other cases, the error may affect operation over an extended time period, causing major operational errors or complete breakdown of the system.

In some electronic systems, the system may only be capable of operating in a finite number of operational states (e.g., a finite state machine). In such a system, a next state may depend, for example, on a current state of the system and current inputs to the system. The inputs to the system may be related to, for example, measurements of one or more operational parameters of the system made by sensor elements in the system, or some other data. After a next operational state has been determined for the system, state information may be stored within one or more state registers (or other digital storage locations) of the system. As will be appreciated, any errors that occur in the state information stored in a system may impact future operation of the system. That is, incorrect state information may cause a system to think that it is in a different state than it actually is, thus causing all future states, and decisions made based on those states, to be in error.

Therefore, it is desirable that such errors be detected and appropriate corrective action be taken as early as possible.

Figure 1:
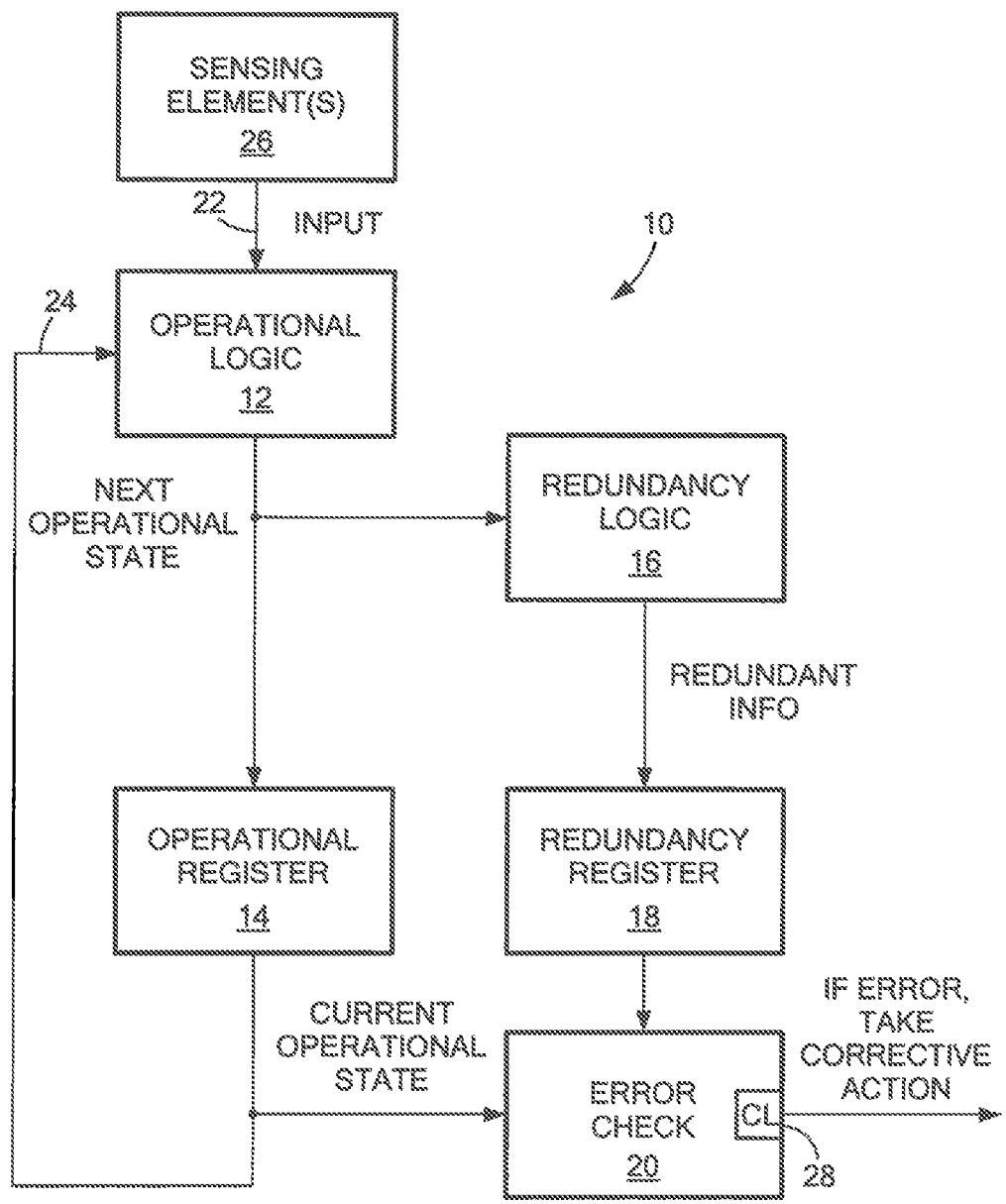
FIG. 1 is a block diagram illustrating an exemplary system for detecting and recovering from errors caused by electrical and/or mechanical stresses in accordance with an embodiment.

FIG. 1 is a block diagram illustrating an exemplary electronic system 10 that is capable of detecting and recovering from errors in logic state caused by electrical and/or mechanical stresses in accordance with an embodiment. Electronic system 10 of FIG. 1 may be, for example, a sensor system for use within an automobile or other vehicle, although other types of systems may alternatively be used. An exemplary sensor system that could benefit from the principles and techniques described herein is described in U.S. Pat. No. 5,650,719, which is co-owned with the present application and is hereby incorporated by reference in its entirety. As shown in FIG. 1, system 10 may include: operational logic 12, an operational register 14, redundancy logic 16, a redundancy register 18, and error checking logic 20. System 10 is capable of being in any of a number of different operational states at a particular point in time. Operational register 14 is operative for storing a current operational state of system 10. Operational logic 12 is operative for determining a next operational state of system 10 based on, for example, a current operational state of the system and current system inputs. Operational logic 12 may include, for example, combinational logic circuitry in some implementations. As will be described in greater detail, redundancy logic 16, redundancy register 18, and error checking logic 20 may be used to identify errors in logic state information stored in operational register 14 before the errors have a chance to compromise system operation. Error checking logic 20 may also include circuitry for initiating corrective action when errors are detected in the system state information.

In sensor-based applications, the information stored within operational register 14 may include, or be derived from, information collected by one or more sensor elements 26 in system 10. Some or all of the information stored within operational register 14 may also include state information associated with one or more state machines of system 10. As described above, operational logic 12 is operative for determining a next operational state of system 10. Operational logic 12 may also be operative for generating the output of system 10 (e.g., a sensed signal, etc.). As shown, operational logic 12 may receive input information at an input port 22 for use in determining the next operational state. Operational logic 12 may also receive information identifying the current operational state of system 10 at a second input 24. Operational logic 12 may use the input information and/or the current state information to determine the next operational state.

After operational logic 12 has determined the next operational state, the state information may be stored within operational register 14. Once stored, in operational register 14, the next operational state becomes the current operational state of system 10. As shown, the current operational state stored in operational register 14 may be coupled back to input 24 of operational logic 12 for use in determining a next operational state. In some embodiments, system 10 of FIG. 1 may be a synchronous circuit operating in conjunction with a clock signal. In these implementations, a new operational state may be stored in operational register 14 for each new clock cycle. Non-synchronous implementations also exist.

In some embodiments, the operational state information stored within operational register 14 may include state information for the full electronic system that includes the register 14 (e.g., a magnetic field sensor within an automobile, etc.). In other embodiments, operational register 14 may include only a portion of the state information of the full system (e.g., the operational state of a single state machine in the system, information associated with a particular measured parameter in the system, etc.). In some implementations, multiple different versions of system 10 of FIG. 1 may be present within a larger system to detect errors in different portions of the state information of the larger system.

As described above, in some embodiments, some or all of the information stored within operational register 14 may be state information associated with a state machine of the underlying system. In such embodiments, operational logic 12 may determine the next operational state based on the current operational state of system 10 and input information received at input 22. That is, given the current state of the state machine, the input information may dictate which next state the state machine is to enter.

In other embodiments, some or all of the operational state information stored in operational register 14 may be related to measurements of operational parameters made by sensor elements 26 associated with system 10. For example, in a proximity detector that is designed to detect the approach and retreat of individual teeth of a rotating gear based on magnetic fields, the detector may keep track of the maximum and minimum magnetic field intensities measured during the detection process to establish, for example, detection thresholds. This maximum and minimum magnetic field intensity information may make up part of the current operational state of system 10 stored in operational register 14. In some sensors, instead of detecting gear teeth, the sensor may detect the different magnetic domains of a rotating ring magnet. In these sensors, maximum and minimum magnetic field intensities may also be tracked, and these values may also make up part of the current operational state of the sensor system. Other or alternative types of measured parameter data may also be part of the state information stored in operational register 14 in other embodiments.

In some operational scenarios, external stresses may be placed upon system 10 that cause the state information stored, within operational register 14 to have one or more errors. For example, large interference signals that occur during a write operation may cause data to be incorrectly recorded within a register or memory location. In some cases, interference may also cause information already stored within a register or memory to change state. Once an incorrect value is stored within operational register 14, subsequent operation of system 10 may be corrupted. That is, all future state determinations of operational logic 12 may be based upon an incorrect current state. In this manner, the current error can carry through to all future system operation unless corrective action is taken. For example, if the system 10 includes a state machine, external stresses may cause an incorrect state to be stored in operational register 14 for the state machine. Because the current state is incorrect all future state determinations made by operational logic 12 may also be incorrect. Similarly, if maximum magnetic field intensity information is stored in operational register 14 for use in detection, threshold determination, external stresses may cause the maximum intensity value to be increased by a large amount. This error may then cause incorrect threshold values to be calculated in all subsequent operation.

To prevent problems related to errors in state information, redundancy logic 16, redundancy register 18, and error checking logic 20 may be used to identify errors in the stored state information before they have a chance to compromise subsequent system operation. In some implementations, redundancy logic 16, redundancy register 18, and error checking logic 20 may be made a part of an initial system design, in other implementations, redundancy logic 16, redundancy register 18, and error checking logic 20 may be added to an already existing system as a retrofit, without impacting the existing system design.

As shown in FIG. 1, redundancy logic 16 may be coupled to receive state information associated with a next operational state from operational logic 12. Redundancy logic 16 may use this state information to generate redundant information. The redundant information may take many forms and is selected to be useable by error checking logic 20 to identify errors in the stored state information. The redundant information may then be stored within redundancy register 18 at about the same time that the state information for the next operational state is stored in operational register 14. Error checking logic 20 may continually process the redundant information stored in redundancy register 18 and the state information stored in operational register 14 to determine whether an error has occurred in system 10. If the two pieces of information are not compatible, then it may be assumed that an error has occurred and correction logic 28 within error checking logic 20 may initiate corrective action. If the two pieces of information are compatible, then correction logic 28 may allow system 10 to continue operating in its normal manner. In at least one implementation, error checking logic 20 may process the redundant information and the state information to check for an error condition for each cycle of a clock signal, although other timing schemes may alternatively be used.

The redundant information generated by redundancy logic 16 may include any type of information that may subsequently be used to "check" the accuracy of the state information stored within operational register 14. In a relatively simple implementation, the redundant information may include a single parity hit. The parity bit may be generated, for example, so that the bits of the next operational state determined by operational logic 12, plus the parity bit, will result in an even (or odd) number of ones. The parity bit may be stored within redundancy register 18. When a parity bit is used, error checking logic 20 may perform an error check by, for example, retrieving state information from operational register 14 and the parity bit from redundancy register 18 and determining whether the total number of ones for both pieces of information is even (or odd). If not, it may be assumed that at least one error exists in the state information and corrective action may be initiated. As will be appreciated, the parity bit approach will not work if there are two bit errors (or an even number of bit errors) within the state information.

In some embodiments, one or more error detection or error correction codes may be used to generate the redundant information. As is known, various error detection codes exist that allow a user to detect multiple errors within corresponding information (e.g., checksum codes, cyclic redundancy checks, hash functions, etc.), typically up to a maximum number of errors. In some implementations, redundancy logic 16 may generate the redundant portion of an error detection codeword for the next operational state and store the redundant portion in redundancy register 18. Error checking unit 20 may then execute a corresponding error detection process using the information from operational register 14 and redundancy register 18 to determine whether any errors exist in the state information.

Error correction codes that are capable of detecting and also correcting errors in the state information may be used in some implementations. When an error correction code is used to generate the redundant information, error checking logic 20 may, in some embodiments, only use the error detection capability of the code to detect errors in the state information. In other implementations, however, the error correcting capabilities of the code may be used to correct the state information stored within operational register 14 as part of the corrective action of error checking logic 20.

In some embodiments, the redundant information stored in redundancy register is may include a full copy of the next operational state information generated by operational logic 12. In these embodiments, the error check performed by error checking logic 20 may comprise a simple bit by bit comparison. As will be appreciated, the method selected to provide the redundant information in a particular implementation will typically depend on factors such as the frequency of undetected errors that is deemed tolerable in the system, the computational resources that are available for forming and processing the redundant information, the electrical power available to power the computational resources, the speed with which the redundancy/detection calculations can be performed, and/or other factors.

As described above, errors within the state information stored within operational register 14 are undesirable because they can compromise both present and future operation of fee system. Therefore, the corrective action that is initiated by error checking unit 20 when one or more errors are detected may be directed toward placing the system 10 back into a safe state that will not compromise future operation. In at least one implementation, error checking unit 20 may initiate a full system reset when one or more errors are detected within the state information. When a system reset is performed, a recalibration process may be initiated where all current state information will be replaced based on newly received input 22. Therefore, the effects of the errors in the operational state information will be fully removed from the system.

In some implementations, the corrective action initiated by error checking logic 20 may include setting some or all of the operational state information within operational register 14 to a "safe" value that will not carry over into future operations. This may be performed without requiring a full system reset. For example, in one implementation, the state information stored within operational register 14 may include information that hanks a peak magnetic field reading of one or more sensor elements within system 10. If an error is subsequently identified within the state information, the peak magnetic field information may be reset to a low value that will not create errors in the future (e.g., a value that is known to be lower than typical peak magnetic field readings in the system). In some other implementations, the corrective action initiated by error checking logic 20 may include sending an alert message to a user of system 10 to inform the user of the error(s) and to allow tire user to take further corrective action. As described above, in still other implementations, the state information within operational register 14 may be corrected using the error correction capability of an error correction code. Other corrective actions may alternatively be taken. In addition, combinations of the above described corrective actions may alternatively be used.

Although described above as separate registers, it should be appreciated that the functions of operational register 14 and redundancy register 18 may be realized using any of a wide variety of different data storage configurations. That is, these storage functions may be provided using any type of digital data storage device, or combination of data storage devices, that are capable of achieving the necessary storage and retrieval speeds. For example. In one approach, the functions of operational register 14 and redundancy register 18 may be realized using a single register. In some embodiments, the functions of one or both of the registers 14, 18 may be realized using multiple separate data storage devices and/or memory locations within system 10. The functions of the two registers 14, 18 may, for example, be realized using multiple different locations within a common semiconductor memory device (e.g., RAM memory, flash memory, etc.). Likewise, memory locations within different semi conductor memories may be used. In some embodiments, flip flops may be used for operational register 14 and redundancy register 18. Other forms of digital data storage, or combinations of different forms of digital data storage, may be used in other implementations. In some embodiments, analog storage may be used for the redundant information.

In at least one implementation, system 10 of FIG. 1 may be part of an integrated circuit (IC) having a predetermined function. For example, in one implementation, system 10 may be included within a sensor IC for use in sensing one or more operational parameters of a larger system. In some implementations, system 10 may be adapted for use within vehicular applications that use sensors such as, for example, magnetic linear and angular position sensors, magnetic digital position sensors, current sensors, magnetic speed sensors, and/or others. Each of these types of sensors may make use of one or more magnetic field sensing elements, which may include, for example, Hall effect elements, magnetoresistance elements, magnetotransistor elements, and/or others. In other implementations, system 10 may be adapted for use in non-vehicular applications and/or non-sensor applications. In a non-sensor application, the inputs to operational logic 12 may be from a source other than a sensing element.

Figure 2:
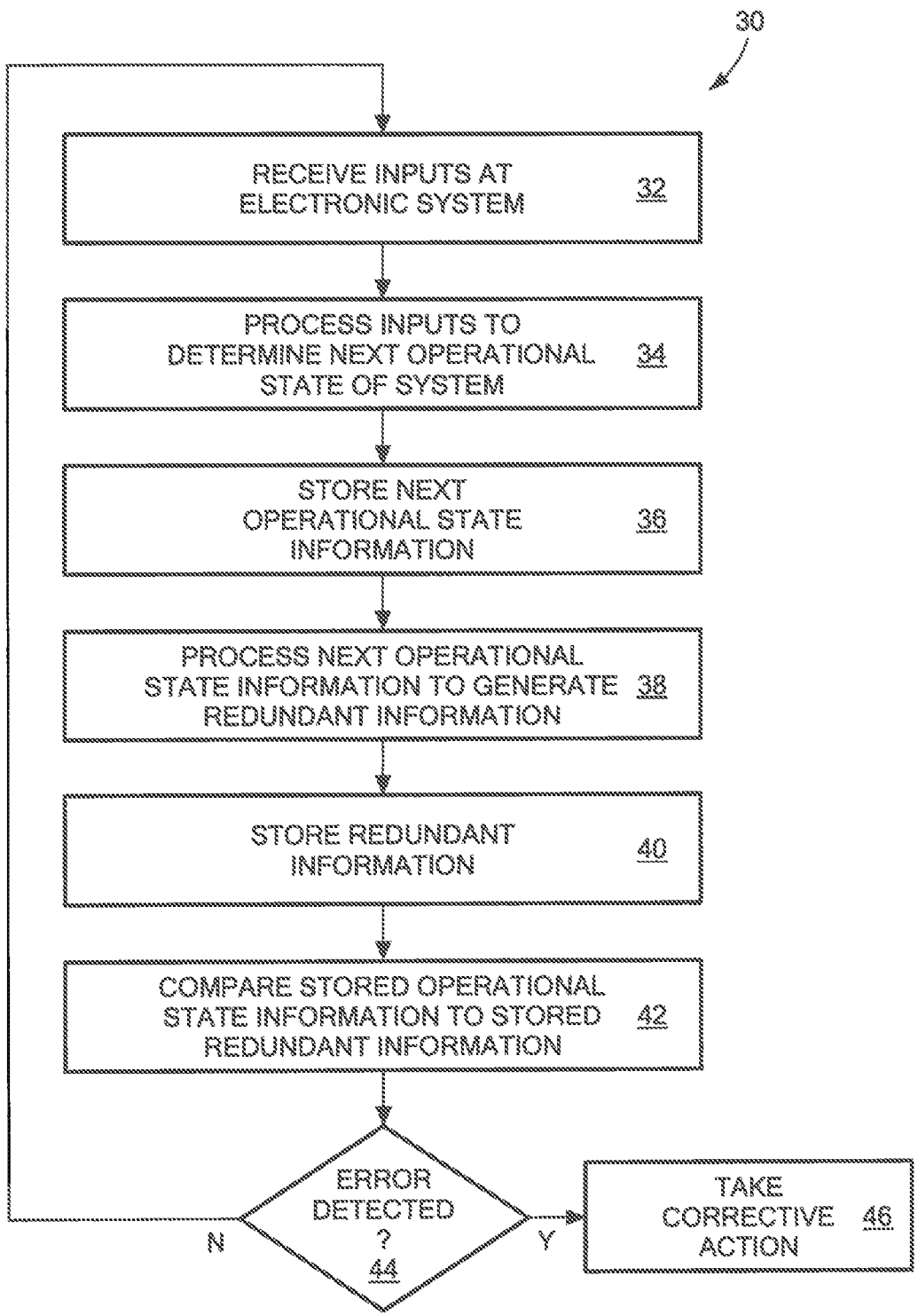
FIG. 2 is a flow diagram illustrating a process for detecting and recovering from errors in an electrical system in accordance with an embodiment.

FIG. 2 is a flow diagram illustrating a process 30 for detecting and recovering from errors in an electronic system in accordance with an embodiment.

The rectangular elements (typified by element 32 in FIG. 2) are herein denoted "processing blocks" and may represent computer software instructions or groups of instructions. It should be noted that the flow diagram of FIG. 2 represents one exemplary embodiment of a design described herein and variations in such a diagram, which generally follow the process outlined, are considered to be within the scope of the concepts, systems, and techniques described and claimed herein.

Alternatively, the processing blocks may represent operations or actions performed by functionally equivalent circuits such as, for example, a digital signal processor (DSP), an application specific integrated circuit (ASIC), a field programmable gate array (FPGA), or other circuitry. Some processing blocks may be manually performed while other processing blocks may be performed by a processor, a circuit, or other machine. The flow diagram, does not depict the syntax of any particular programming language. Rather, the flow diagram illustrates the functional information one of ordinary skill in the art requires to fabricate circuits and/or to generate computer software to perform the required processing. It should be noted that many routine program elements, such as initialization of loops and variables and the use of temporary variables may not be shown. It will be appreciated by those of ordinary skill in the art that unless otherwise indicated herein, the particular sequence described is illustrative only and can be varied without departing from the spirit of the concepts described and/or claimed herein. Thus, unless otherwise stated, the processes described below are unordered meaning that, when possible, the sequences shown in FIG. 2 can be performed in any convenient or desirable order.

Referring now to FIG. 2, process 30 will now be described. First, one or more input signals may be received at the electronic system (block 32). The input signals may include, for example, measurements made of one or more operational parameters using, for example, sensor elements or the like. The inputs are next processed to determine a next operational state of the system (block 34). The next operational state of the system may then be stored within an operational register or other digital storage structure(s) (block 36). Once stored, the next operational state information becomes the current operational state of the system. The next operational state information may also be processed to generate redundant information (block 38). The redundant information may be stored within, a redundancy register or other digital or analog storage structure(s) (block 40). In some implementations, the next operational state information may be stored within the operational register at approximately the same time that the redundant information is stored in the redundancy register (e.g., in response to the same clock cycle).

The current operational state information stored in the operational register may subsequently be processed along with the redundant information stored in the redundancy register to determine whether one or more errors exist (block 42). If one or more errors are detected, corrective action may be initiated (block 44-Y, 46). If no errors are detected, method 30 may return to block 32 and the process may be repeated using newly received inputs. In a synchronous circuit, the method 30 described above may be repeated once per clock cycle, in some implementations. As described previously, the corrective action that is initiated may include, for example, a full or partial system reset, a recalibration, setting some or all of the operational state information within an operational register to a "safe" value, sending an alert message to a user of the system, correcting the system state information using an error correction code, and/or other actions, including combinations of the above.

Although described above in the context of sensors used in vehicular applications, it should be appreciated that the systems, circuits, features, and techniques described herein may also be used in other electronics applications. These applications may include, for example, other sensor-related applications, LED driver circuit applications, motor driver circuit applications, regulator circuit applications, photoflash driver circuits applications, and/or others. In each of these different applications, the principles described herein may be used to detect errors within system state information caused by, for example, external stresses on the system, and to recover from those errors.

As used herein, the term "magnetic field sensing element" is used to describe a variety of electronic elements that can sense a magnetic field. The magnetic field sensing element may include, but is not limited to, a Hall effect, element, a magnetoresistance element, or a magnetotransistor. As is known, there are different types of Hall effect elements including, for example, planar Hall elements, vertical Hall elements, Circular Vertical Hall (CVH) elements, and others. As is also known, there are different types of magnetoresistance elements including, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations (e.g., a half bridge or foil (Wheatstone) bridge). Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements may have an axis of maximum sensitivity parallel to a substrate that supports the magnetic field sensing element and some others may have an axis of maximum sensitivity perpendicular to a substrate that supports the magnetic field sensing element. In particular, planar Hall elements tend to have axes of sensitivity perpendicular to a substrate, while metal based, or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic held sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used, in combination with a back-biased or other magnet, and a magnetic field sensor that senses a magnetic field density of a magnetic field.

Having described exemplary embodiments of the invention, it will now become apparent to one of ordinary skill in the art that other embodiments incorporating their concepts may also be used. The embodiments contained herein should not be limited to disclosed embodiments bat rather should be limited only by the spirit and scope of the appended claims. All publications and references cited herein are expressly incorporated herein by reference in their entirety.

What is claimed is:

1. An electronic sensor system for use in an environment prone to mechanical and electrical overstress conditions, comprising:
   at least one sensor element to measure one or more operational parameters of the electronic sensor system;
   first digital storage circuitry to store a current operational state of the electronic sensor system, wherein the current operational state information stored in the first digital circuitry can include one or more errors caused by mechanical and overstress conditions;
   operational logic to determine a next operational state of the electronic sensor system based, at least in part, on an input signal from the at least one sensor element;
   redundancy logic to generate redundant information associated with the next operational state determined by the operational logic;
   second digital storage circuitry to store the redundant information; and
   error checking logic to determine compatibility of the current operational state stored in the first digital storage circuitry with the redundant information stored in the second digital storage circuitry to determine whether the current operational state information includes the one or more errors, the error checking logic including correction logic to initiate corrective action for the electronic system if the one or more errors is detected by the error checking logic.

2. The electronic sensor system of claim 1, wherein:
   the correction logic is configured to initiate a system reset of the electronic sensor system if an error is detected by the error checking logic, wherein the system reset includes a recalibration process where all current state information is replaced based on new input from the at least one sensor element.

3. The electronic sensor system of claim 1, wherein:
   the correction logic is configured to send an alert to an operator of the electronic sensor system if an error is detected by the error checking logic.

4. The electronic sensor system of claim 1, wherein:
   the correction logic is configured to modify the current operational state information stored in the first digital storage circuitry to a safe state that will not produce future errors in the electronic sensor system if an error is detected by the error checking logic.

5. The electronic sensor system of claim 1, wherein:
   the redundant information generated by the redundancy logic includes error correction coded redundant information; and
   the correction logic is configured to perform an error correction operation using the error correction coded redundant information to correct the current operational state information stored in the first digital storage circuitry if an error is detected by the error checking logic.

6. The electronic sensor system of claim 1, wherein:
   the input signal of the operational logic is derived from an output signal of at least one sensing element that is operative for sensing features of a rotating structure.

7. The electronic sensor system of claim 1, wherein:
   the input signal of the operational logic is derived from an output signal of at least one magnetic field sensing element.

8. The electronic sensor system of claim 7, wherein:
   the at least one magnetic field sensing element includes at least one of: a Hall effect element, a magnetoresistance element, or a magnetotransistor.

9. The electronic sensor system of claim 1, wherein:
   the redundant information generated by the redundancy logic includes a parity bit.

10. The electronic sensor system of claim 1, wherein:
    the redundant information generated by the redundancy logic includes a checksum.

11. The electronic sensor system of claim 1, wherein:
    the redundant information generated by the redundancy logic includes an error detection code.

12. The electronic sensor system of claim 1, wherein:
    the redundant information generated by the redundancy logic includes an error correction code.

13. The electronic sensor system of claim 1, wherein:
    the redundant information generated by the redundancy logic includes a full copy of the next operational state information determined by the operational logic.

14. The electronic sensor system of claim 1, wherein:
    the operational logic includes at least one state machine.

15. The electronic sensor system of claim 1, wherein:
    the operational logic is configured to determine the next operational state of the electronic sensor system based on the input signal and the current operational state of the electronic sensor system.

16. The electronic sensor system of claim 1, wherein:
    the first digital storage circuitry is different from the second digital storage circuitry.

17. The electronic sensor system of claim 1, wherein:
    the first digital storage circuitry includes an operational register and the second digital storage circuitry includes a redundancy register that is different from the operational register.

18. A method for use in detecting and recovering from logic state errors in an electronic system that uses one or more sensor elements to measure operational parameters of the electronic system in an environment prone to mechanical and electrical overstress conditions, comprising:

receiving one or more input signals from one or more sensor elements;

processing the one or more input signals to determine a next operational state associated with the electronic system;

processing the next operational state information to generate redundant information;

storing the next operational state information in first digital storage circuitry, the next operational state information becoming current operational state information once stored, wherein the current operational state information stored in the first digital storage circuitry can include one or more errors caused by mechanical and electrical overstress conditions;

storing the redundant information in second digital storage circuitry;

determining compatibility of the operational state information with the stored redundant information to determine whether the one or more errors exist in the stored operational state information; and initiating corrective action if the one or more errors are detected in the stored operational state information.

19. The method of claim 18, further comprising:

repeating receiving, processing the one or more input signals, processing the next operational state information, storing the next operational state information, storing the redundant information, and processing the stored operational state information with the stored redundant information if no errors are detected in the stored operational state information.

20. The method of claim 18, wherein:

initiating corrective action includes initiating a system reset if one or more errors are detected in the stored operational state information, wherein the system reset includes a recalibration process where all current state information is replaced based on new input from the one or more sensor elements.

21. The method of claim 18, wherein:

initiating corrective action includes sending an alert to an operator of the electronic system if one or more errors are detected in the stored operational state information.

22. The method of claim 18, wherein:

initiating corrective action includes modifying the stored operational state information to a safe state that will not produce future errors in the electronic system if one or more errors are detected in the stored operational state information.

23. The method of claim 18, wherein:

processing the next operational state information to generate redundant information includes using an error correctional code to generate error correction coded redundant information; and initiating corrective action includes performing an error correction operation using the error correction coded redundant information to correct the stored operational state information if one or more errors are detected in the stored operational state information.

24. The method of claim 18, wherein:

receiving one or more inputs signals from one or more sensor elements includes receiving one or more inputs signals from a sensor element that is operative for sensing features of a rotating structure.

25. The method of claim 18, wherein:

receiving one or more inputs signals includes receiving one or more inputs signals that are derived from an output signal of at least one magnetic field sensing element, the at least one magnetic field sensing element including at least one of: a Hall effect element, a magnetoresistance element, or a magnetotransistor.

26. The method of claim 18, wherein:

processing the next operational state information to generate redundant information includes processing the next operational state information to generate a parity bit.

27. The method of claim 18, wherein:

processing the next operational state information to generate redundant information includes processing the next operational state information to generate a checksum.

28. The method of claim 18, wherein:

processing the next operational state information to generate redundant information includes processing the next operational state information to generate an error detection codeword.

29. The method of claim 18, wherein:

processing the next operational state information to generate redundant information includes processing the next operational state information to generate an error correction codeword.

30. The method of claim 18, wherein:

processing the next operational state information to generate redundant information includes making a copy of the next operational state information.

\* \* \* \* \*